(12) United States Patent
Shen et al.

(10) Patent No.: US 8,279,989 B2
(45) Date of Patent: Oct. 2, 2012

(54) DEVICE AND PROCESS FOR DATA RATE ACQUISITION

(75) Inventors: Bo Shen, Shanghai (CN); Liping Chen, Shanghai (CN)

(73) Assignee: Entropic Communications, Inc., San Diego, CA (US)

( * ) Notice: Subject to any disclaimer, the term of this patent is extended or adjusted under 35 U.S.C. 154(b) by 755 days.

(21) Appl. No.: 12/375,563

(22) PCT Filed: Aug. 2, 2006

(86) PCT No.: PCT/CN2006/001936
§ 371 (c)(1),
(2), (4) Date: Mar. 26, 2009

(87) PCT Pub. No.: WO2008/017205
PCT Pub. Date: Feb. 14, 2008

(65) Prior Publication Data
US 2009/0262874 A1 Oct. 22, 2009

(51) Int. Cl.
*H04L 7/00* (2006.01)

(52) U.S. Cl. ........ 375/355; 375/353; 375/354; 375/326; 375/232; 375/327; 375/324; 375/216; 375/235

(58) Field of Classification Search ................ 375/355, 375/216, 232, 235, 236, 324, 326, 327, 353, 375/354; 341/139, 156
See application file for complete search history.

(56) References Cited

U.S. PATENT DOCUMENTS

| | | | |
|---|---|---|---|
| 5,468,993 A | 11/1995 | Tani | |
| 6,282,248 B1 * | 8/2001 | Farrow et al. | 375/324 |
| 6,295,325 B1 * | 9/2001 | Farrow et al. | 375/327 |
| 6,624,691 B1 | 9/2003 | Sasaki | |
| 6,678,751 B1 * | 1/2004 | Hays et al. | 710/8 |
| 6,879,646 B2 | 4/2005 | Arambepola | |
| 7,738,639 B2 * | 6/2010 | Sidhu et al. | 379/93.08 |
| 2004/0047430 A1 * | 3/2004 | McCarty, Jr. | 375/295 |
| 2005/0010945 A1 * | 1/2005 | Hayashi | 725/31 |

FOREIGN PATENT DOCUMENTS

| CN | 1339216 B1 | 3/2002 |
|---|---|---|
| CN | 1464708 A | 12/2003 |

* cited by examiner

*Primary Examiner* — Dhaval Patel
(74) *Attorney, Agent, or Firm* — Hultquist, PLLC; Steven J. Hultquist; Frank J. Bozzo

(57) ABSTRACT

A baud rate acquisition circuit (10) for synchronizing a sampling signal with an input signal operates in broad rate sweeping and a rate fine tuning phases. In the rate sweeping phase, a timing error detector (24) examines the sampling signal generated by a decimator (16). If the sampling signal is outside a rate acquisition range from the target rate, a rate sweeping algorithm selects a new sampling rate. In response to the sampling rate within the rate acquisition range, the timing error detector (24) examines the asymmetry thereof to generate a rate correction signal to synchronize the sampling signal with the input signal. Next in the rate fine tuning phase, a multiplexer (22) routes the sampling signal through a square root filter (18). By examining the waveform shaped signal, the time error detector (24) synchronizes the sampling signal with the input signal with high accuracy.

40 Claims, 2 Drawing Sheets

10

DEVICE AND PROCESS FOR DATA RATE ACQUISITION

CROSS-REFERENCE TO RELATED APPLICATIONS

This is a U.S. national phase application under the provisions of 35 U.S.C. §371 of International Application No. PCT/CN06/01936 filed on Aug. 2, 2006 and published on Feb. 14, 2008 as International Publication No. WO 2008/017205. The disclosure of such international application and publication are hereby incorporated by reference herein in their respective entireties, for all purposes.

FIELD OF THE INVENTION

This invention relates, in general, to signal transmission and, more particularly, to acquiring digital signal transmission rate during demodulation.

BACKGROUND OF THE INVENTION

Because of its high efficiency and fidelity, digital data transmission is becoming widely used in such areas as wireless communication, broadcasting, etc. During the transmission, data is encoded in one or more carrier wave signals using a modulation scheme, e.g., amplitude modulation, frequency modulation, phase modulation, pulse width modulation. At the receiver, the modulated carrier wave signals are demodulated and the data is decoded there from.

For example, High Definition Television (HDTV) broadcasting often uses Quadrature Phase Shift Keying (QPSK) and Quadrature Amplitude Modulation (QAM) schemes. In order to demodulate the carrier wave signals and decode the data, a receiver must be synchronized to the transmitter in data transmission rate, generally referred to as baud rate. This is generally achieved by a timing recovery loop. In one baud rate synchronization approach, a down converter generates a base band signal from the received QAM signal. The base band QAM signal is fed to a variable decimator controlled by a numerically controlled oscillator in the timing recovery loop. The variable decimator generates a sampling signal with a sampling rate controlled by the numerically controlled oscillator. A square root filter performs pulse shaping on the sampling signal, which is then transmitted to a timing error detector. The timing error detector generates a timing error signal indicating whether the sampling rate is synchronized with the baud rate of the received signal. The timing error signal is transmitted to the numerically controlled oscillator via a loop filter to adjust the sampling rate of the variable decimator.

The square root filter in the timing recovering loop generally has a large delay, which results in small baud rate acquisition range. In order for such a timing recovery loop acquire the target rate, the initial baud rate estimate must be relatively close to the target rate. In other words, the receiver of the QAM signal must know at least the approximate baud rate of the transmitted QAM signal in advance. Otherwise, the receiver must perform a rate sweeping process with sweeping steps equal to or smaller than the rate acquisition range. A typical timing recovery loop has an acquisition range less than 400 parts per million. For a QAM signal having a baud rate range between one and seven megabytes per second, it may take up to several minutes to acquire the target rate. This may be frustrating to a user who has to wait several minutes to view a TV program after turning on the TV set.

Accordingly, it would be advantageous to have a device and a process that can quickly acquire the target rate in digital signal transmission. It is desirable for the device to be simple and cost efficient. It is also desirable for the rate acquisition process to be able to acquire the data transmission rate over a wide range.

DETAILED DESCRIPTION OF VARIOUS EMBODIMENTS

Figure 1:
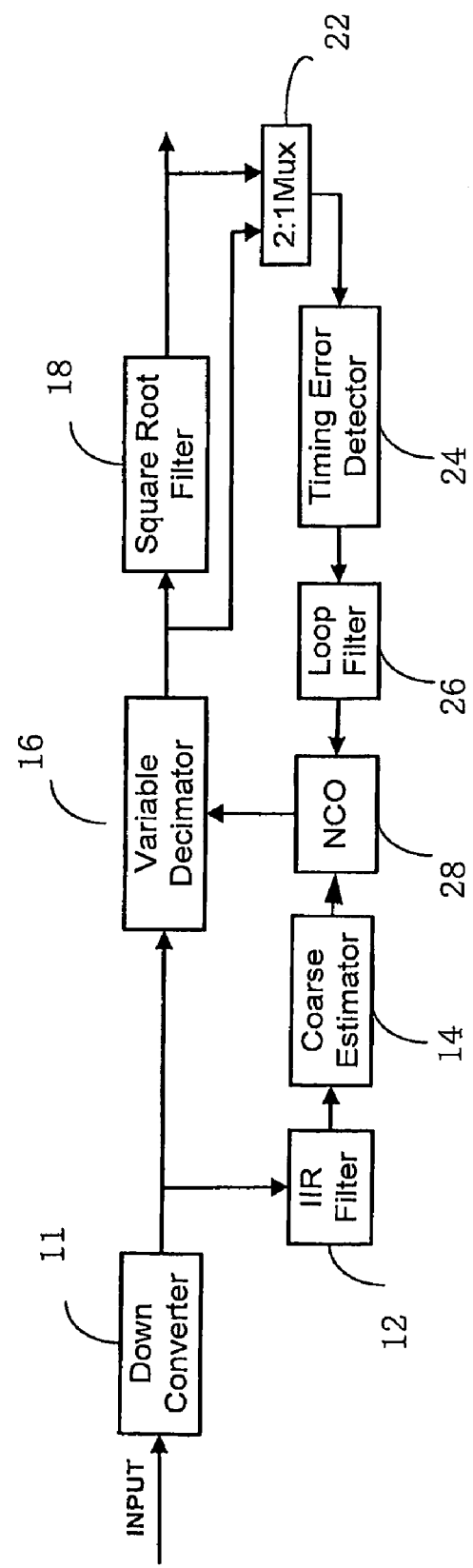
FIG. 1 is a functional block diagram illustrating a data transmission rate synchronization circuit in accordance with an embodiment of the present invention.

Various embodiments of the present invention are described herein below with reference to the figures, in which elements of similar structures or functions are represented by like reference numerals throughout the figures. It should be noted that the figures are only intended to facilitate the description of the preferred embodiments of the present invention. They are not intended as an exhaustive description of the present invention or as a limitation on the scope of the present invention or a baud rate acquisition circuit.

FIG. 1 is a functional block diagram illustrating a baud rate synchronization circuit 10 in accordance with an embodiment of the present invention. By way of example, baud rate synchronization circuit 10 can serve in a digital signal receiver such as a high definition television (HDTV) receiver to acquire the signal transmission rate in the input digital signal and synchronize the sampling rate of the receiver with the data transmission rate of the input signal. Therefore, baud rate acquisition circuit 10 is also referred to as a data transmission rate acquisition circuit.

Baud rate acquisition circuit 10 includes a down converter 11 having an input coupled for receiving the input digital signal and an output. By way of example, the input of down converter 11 is coupled to a tuner (not shown in FIG. 1) for receiving the input signal. For HDTV broadcasting, the frequency of the signal may be in the very high frequency (VHF) band of between 30 Mega-Hertz (MHz) and 300 MHz or the ultra high frequency (UHF) band between 300 MHz and 3 Giga-Hertz (GHz). The tuner selects a TV channel and outputs the an intermediate frequency (IF) signal with a center frequency at 36 MHz or 44 MHz. Down converter 11 receives the IF signal from the tuner and generates a base band signal.

The base band signal is transmitted to a digital signal filter 12. By way of example, filter 12 can be an infinite impulse responses (IIR) filter or a finite impulse response (FIR) filter. For an impulse response filter, the power of the output signal of filter 12 is inversely proportional to the baud rate of the input signal. The output of filter 12 is connected to a baud rate estimator 14 for providing an estimate of the baud rate of the input signal. An output of baud rate estimator 14 is connected to a first control input of a numerically controlled oscillator (NCO) 28. An output of NCO 28 is connected to a control input of a variable decimator 16.

The base band signal is also transmitted to an input of variable decimator 16. An output of variable decimator 16 is connected to an input of a wave form shaping circuit, e.g., a square root filter 18, and to a first input of a multiplexer 22. An output of square root filter 18 is connected to a second input of multiplexer 22. An output of multiplexer 22 is connected to an input of a timing error detector 24. An output of timing error detector 24 is connected to an input of a low pass loop filter 26. An output of loop filter 26 is connected to a second control input of NCO 28.

In operation, baud rate estimator 14 generates a baud rate estimation signal based on the output of filter 12. In accordance with a preferred embodiment of the present invention, filter 12 is an impulse response filter and baud rate estimator 14 estimates the baud rate of the input signal based on the output power of filter 12. The baud rate estimation signal is transmitted to the first control input of NCO 28, which functions as a rate control signal generator for variable decimator 16. In response to the rate control signal from NCO 28, variable decimator 16 generates a sampling signal with a sampling rate equal to a multiple of the estimated baud rate. In accordance with a specific embodiment of the present invention, variable decimator 16 generates a signal with a sampling rate equal to two times of the estimated baud rate. The sampling signal bypasses square root filter 18 and is transmitted to timing error detector 24 through multiplexer 22. Timing error detector 24 examines the waveform of the sampling signal and tries to synchronize sampling rate of the sampling signal to the baud rate of the input signal. In accordance with a preferred embodiment of the present invention, timing error detector 24 generates an error signal indicating the difference between the sampling rate of the signal generated by variable decimator 16.

A significant jittering in the sampling signal has indicates that the sampling rate is outside an rate acquisition range of the baud rate associated with the sampling signal and the synchronization or rate lock in would fail. In this situation, a rate sweeping algorithm is implemented. Specifically, NCO 28 generates a rate control signal associated with a new rate. In accordance with a specific embodiment of the present invention, the rate sweeping algorithm performs the rate sweeping and selects new rates in a zigzag pattern. Variable decimator 16 generates sampling signals of different sampling rates according to the rate sweeping algorithm. For each sampling rate generated by variable decimator 16, timing error detector 24 detects whether the sampling rate can lock or synchronize with the baud rate of the input signal. The rate sweeping continues until reaching a sampling rate within the baud rate acquisition range of the target rate, indicated by jittering in the sampling signal being below a certain level.

A relatively small jittering in the sampling signal indicates that the sampling rate is within an rate acquisition range of the baud rate associated with the sampling signal. In accordance with a specific embodiment, timing when the jittering in the sampling signal is below a certain level, timing error detector 24 measures a degree of asymmetry in the sampling signal and generates the error signal indicating a difference between the sampling rate and the target rate. In accordance with a preferred embodiment, the error signal is transmitted to NCO 28, which in turn controls variable decimator to the sampling signal with a modified sampling rate. This sampling signal with the modified sampling is transmitted to timing error detector 24 through multiplexer 22 for reevaluation. This synchronization process continues until the sampling rate reaches the target rate. In accordance with another preferred embodiment, the rate difference between the sampling rate and the target rate indicated by the sampling signal with jittering below the certain level is sent to a data storage element (not shown in FIG. 1).

The target rate thus achieved with the sampling signal transmitted from variable decimator 16 to timing error detector 24 directly may be slightly different from the true baud rate of the input signal. To achieve a sampling rate accurately synchronized with the baud rate of the input signal, multiplexer 22 reroutes the signal path from variable decimator 16 to timing error detector 24 though square root filter 18 for pulse or waveform shaping. Timing error detector 24 uses the waveform shaped wave signal to fine tune the sampling rate of variable decimator 16 through NCO 28.

In accordance with a preferred embodiment of the present invention, baud rate acquisition circuit 10 synchronizes the receiver to the input signal in two stages: a rate sweeping stage and a fine tuning stage. During the rate sweeping stage, the output signal of variable decimator 16 is transmitted to timing error detector 24 without going through square root filter 18, thereby providing a wide baud rate acquisition range. After initial locking onto the baud rate, the output signal of variable decimator 16 is transmitted to square root filter 18 for waveform shaping. The waveform shaped output signal of square root filter 18 is then transmitted to timing error detector 24 for fine tuning the sampling rate of variable decimator 16. Through broad sweeping followed by fine tuning, baud rate acquisition circuit 10 is capable of quickly and accurately synchronizing the receiver to the input signal.

Figure 2:
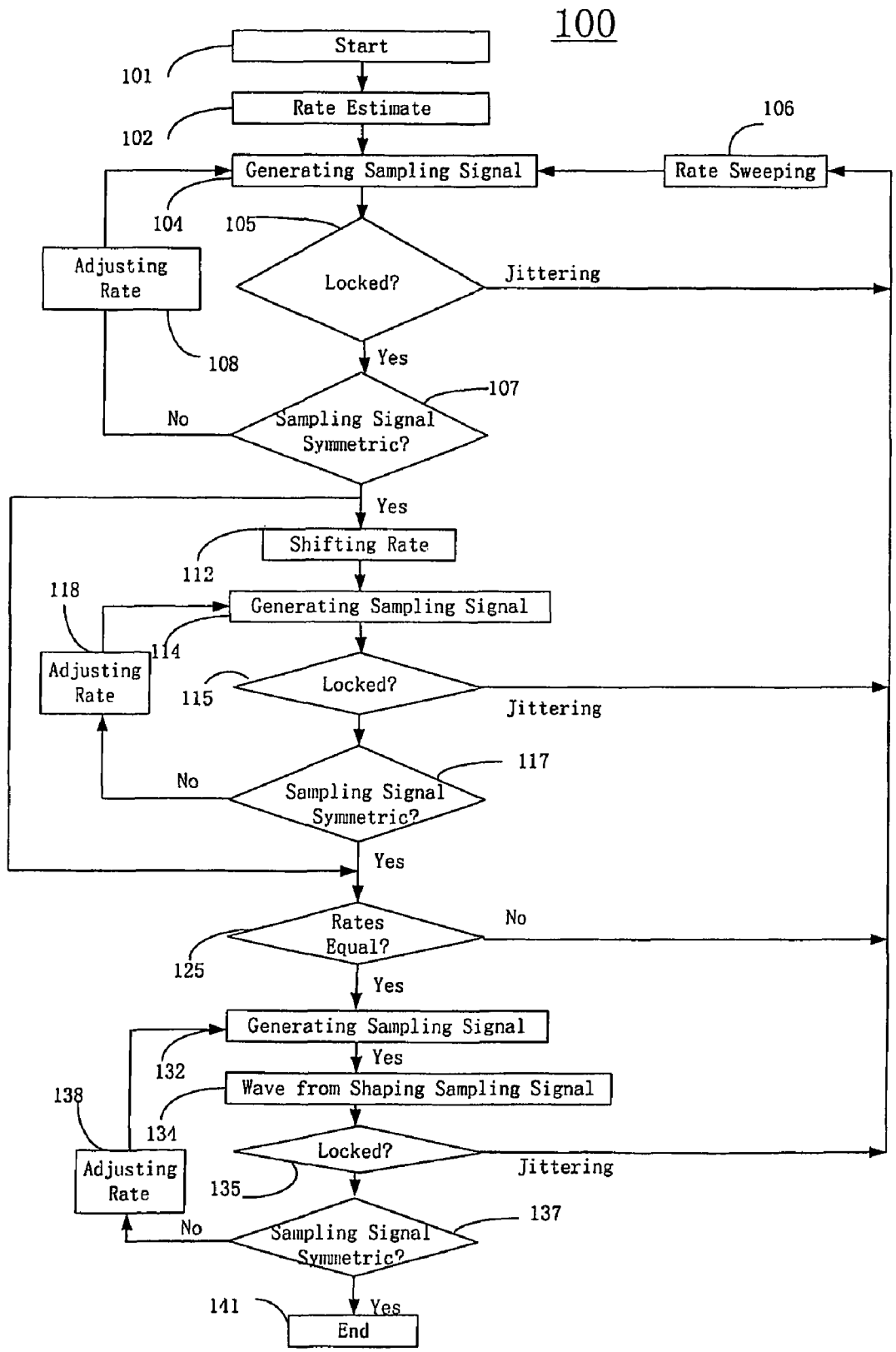
FIG. 2 is a flow chart illustrating a data transmission rate acquisition process in accordance with an embodiment of the present invention.

FIG. 2 is a flowchart illustrating a data transmission rate acquisition process 100 in accordance with an embodiment of the present invention. By way of example, rate acquisition process 100 can be implemented with rate acquisition circuit 10 described herein above with reference to FIG. 1. However, this is not a limitation on the scope of the present invention. In accordance with the present invention, data transmission rate acquisition process 100 can be implanted with other circuit, hardware, or software arrangements. Rate acquisition process 100 is also referred to a data transmission rate synchronization process or a timing recovery process.

Data transmission acquisition process 100 begins with an initialization step 101, in which an input signal is received. In a step 102, process 100 estimates the data transmission rate, which is also referred to as baud rate, of the input signal. In accordance with a specific embodiment of the present invention, process 100 estimates the baud rate of the input signal via an IIR filter, e.g., IIR filter 12 in data acquisition circuit 10 shown in FIG. 1. In accordance with another specific embodiment of the present invention, process 100 estimates the baud rate of the input signal via a FIR filter.

Next in a step 104, process 100 generates a sampling signal having a sampling rate equal to an integral multiple of the estimated baud rate of the input signal. In accordance with a preferred embodiment, the sampling signal has an sampling rate equal to twice of the estimated baud rate. In accordance with a specific embodiment of the present invention, process 100 generates a voltage control signal for a voltage controlled oscillator (VCO) or NCO based on the estimated baud rate. The VCO or NCO generates a rate control signal to control a decimator, e.g., variable decimator 16 shown in FIG. 1, to generate the sampling signal having the sampling rate equal to the integral multiple of the estimated baud rate.

Next in a step 105, process 100 detects whether the sampling rate of the sampling signal is synchronized with baud rate of the input signal. If the sampling rate is in synchronization with baud rate of the input signal, the sampling signal will be stable and symmetrical. Accordingly, process 100 can examine the waveform symmetry of the sampling signal to detect the signal synchronization in accordance with a preferred embodiment of the present invention.

By way of example, process 100 in step 105 detects the sampling signal synchronization using timing error detector 24 in rate synchronization circuit 10 shown in FIG. 1 in accordance with an embodiment of the present invention. Specifically, timing error detector 24 generates an error signal based on the state and property of sampling signal waveform. The error signal indicates a discrepancy between the sampling rate of variable decimator 16 and the target sampling rate for synchronization and is also referred to as an rate correction signal.

A sampling signal with significant jittering indicates a large discrepancy between the sampling rate and the target rate. The sampling signal is out of synchronization with the input signal baud rate and the difference between the sampling rate and the target rate is greater than a rate acquisition range of the circuit, e.g., rate acquisition circuit 10 shown in FIG. 1. A stable sampling signal indicates a relatively small discrepancy between the sampling rate and the target rate. Specifically, the sampling signal is in synchronization with the input signal or at least the difference between the sampling rate and the target rate is less than a rate acquisition range of the circuit, e.g., rate acquisition circuit 10 shown in FIG. 1.

In response to a significant jittering in the sampling signal and sampling rate being detected as being outside the rate acquisition range from the target rate, process 100 shifts the baud rate estimate in a step 106 and returns to step 104 for generating a sampling signal with the shifted sampling rate. In accordance with a preferred embodiment of the present invention, process 100 shifts the baud rate by selecting a new rate using a rate sweeping algorithm. The algorithm may be implemented through software programming or hardware circuit design. In accordance with a specific embodiment of the present invention, process 100 selects new rates in a zigzag pattern during rate sweeping. Generally, a larger sweeping step or rate shift width may achieve baud rate acquisition more quickly, but a smaller sweeping step or rate shift width may achieve baud rate acquisition more accurately. In accordance with a preferred embodiment of the present invention, the baud rate sweeping step is larger than the baud rate acquisition range. In accordance with a specific embodiment of the present invention, the sweeping step or rate shift width is in a range between approximately 1 kHz and approximately 15 kHz in step 106. In accordance with a specific embodiment, the sweeping step or rate shift width is in approximately equal to the estimated baud rate divided by 512 in step 106.

Steps 106, 104, and 105 form a loop of shifting rate by shifting sampling rates, generating rate control signal, generating sampling signal, and detecting synchronization state. The loop continues until the sampling rate is detected as within the rate acquisition range of the target rate, which indicates the sampling signal being close to synchronization with the input signal. This is also referred to as a sampling rate lock.

In response to a stable sampling signal, e.g., the jittering of the sampling signal being smaller than a predetermined level, process 100, in a step 107, calculates the rate discrepancy or rate error between the sampling rate and the target rate by examining the symmetry of the sampling signal, thereby generating a rate correction signal. If the sampling signal is substantially symmetric, e.g., its asymmetry is smaller than a predetermined value, level or criterion, the sampling rate is substantially equal to the target rate.

In accordance with one preferred embodiment of the present invention, the calculated rate discrepancy or rate error is used for adjusting the rate estimate in a step 108. A rate control signal is generated with the adjusted rate and process 100 returns to step 104 of generating the sampling signal with the adjusted sampling rate. Specifically in rate acquisition circuit 10 shown in FIG. 1, NCO 28 generates a modified or adjusted rate control signal. In response to the adjusted rate control signal, variable decimator 16 generates the sampling signal with the adjusted sampling rate. Timing error detector 24 then examines the sampling signal with adjusted sampling rate and generates a new error signal based on the waveform characters. This rate adjusting and error detection cycle of steps 104, 107, and 108 generally continues until the waveform asymmetry reduces to substantially zero or below the predetermined level, which corresponds to the sampling rate being substantially synchronized with or locked onto the baud rate of the input signal. In addition, the cycle may terminate as failing to lock in response to the sampling signal becoming unstable, which indicates the sampling signal out of synchronization with the input signal and the rate discrepancy being larger than the baud rate acquisition range. In response to such state, process 100 proceeds from step 105 to step 106 as described herein above.

In accordance with another preferred embodiment of the present invention, the calculated rate discrepancy is stored in a data storage unit. The locked-in or synchronized rate is set equal to the sampling rate adjusted by the rate discrepancy. In this embodiment, process 100 does not include step 108 and the rate adjusting and error detection cycle of steps 104, 107, and 108.

In order to reduce or avoid the possibility of false rate lock, process 100 preferably examines the stability of the rate synchronization or lock. Specifically, process 100, in a step 112, shifts the baud rate slightly, e.g., between about 0.5 kHz and 8 kHz, from the that locked in through rate synchronization cycle of steps 104, 107, and 108 in one embodiment or calculated by adjusting the baud rate of the sampling signal generated in step 104 with the rate discrepancy calculated in step 107. In a step 114, process 100 generates a sampling signal having a sampling rate equal to an integral multiple of the shifted baud rate.

Next in a step 115, process 100 detects whether the sampling signal is significantly unsynchronized with the input signal. Like step 105 described herein above, step 115 examines the stability of the sampling signal. In response to a significant jittering in the sampling signal and sampling rate being detected as being outside the rate acquisition range from the target rate, process 100 proceeds from step 115 back to step 106 of shifting the rate according to a rate sweeping algorithm.

In response to a stable sampling signal, e.g., the jittering of sampling signal being smaller than a predetermined level, process 100, in a step 117, calculates the discrepancy between the sampling rate and the target rate to generate a rate correction signal by examining the symmetry of the sampling signal. Like in step 107 described herein above, if the sampling signal is substantially symmetric, e.g., its asymmetry is smaller than a predetermined level or criterion, the sampling rate is substantially equal to the target rate.

In accordance with one preferred embodiment of the present invention, the calculated rate discrepancy is used for adjusting the rate estimate in a step 118. A rate control signal is generated with the adjusted rate and process 100 returns to step 114 of generating the sampling signal with the adjusted sampling rate. The rate adjusting and error detection cycle of steps 114, 117, and 118 operates in a way similar that of steps 104, 107, and 108 described above and generally continues until the waveform asymmetry reduces to substantially zero or below the predetermined level, which corresponds to the sampling rate being substantially synchronized with or locked onto the baud rate of the input signal. In addition, the cycle may terminate as failing to lock in response to the sampling signal becoming unstable, which indicates the sampling rate out of synchronization with the input signal and baud rate the baud discrepancy being larger than the baud rate acquisition range. In response thereto, process 100 proceeds from step 115 to step 106 as described herein above.

In accordance with another preferred embodiment of the present invention, the calculated rate discrepancy is stored in a data storage unit. The locked-in or synchronized rate is set equal to the sampling rate adjusted by the rate discrepancy. In this embodiment, process 100 does not include step 118 and the rate adjusting and error detection cycle of steps 114, 117, and 118.

In response to a successful lock or synchronization of the sampling signal in step 115, process 100 proceeds to a step 125 to compare the two locked rates from step 107 and 117. If the two locked rates are different, it indicates a false lock. In response thereto, process 100 selects a new sampling rate in step 106 and returns to step 104. If the two locked rates are substantially equal to each other, process 100 proceeds to a step 132 of generating a sampling rate with a sampling rate equal to that from synchronization steps 107 and 117.

Next in a step 134, process 100 performs waveform shaping the sampling signal generated in step 132. By way of example, the waveform shaping in step 134 can be performed by a filter, e.g., square root filter 18 in rate acquisition circuit 10 shown in FIG. 1. Specifically, in accordance with a preferred embodiment of the present invention, multiplexer 22 routes the sampling signal from variable decimator 16 to timing error detector 24 through square root filter 18 for waveform shaping in step 134.

In a step 135, process 100 examines the waveform shaped sampling signal for synchronization. Like steps 105 and 115 described herein above, step 135 examines the waveform of the shaped sampling signal. In response to a significant jittering in the sampling signal and sampling rate being detected as being outside the rate acquisition range from the target rate, process 100 proceeds from step 135 back to step 106 of shifting the rate according to a rate sweeping algorithm.

In response to a stable sampling signal, e.g., the jittering of sampling signal being smaller than a predetermined level, process 100, in a step 137, generates a rate discrepancy signal, a rate error signal, or a rate correction signal by examining the symmetry of the sampling signal. Like in steps 107 and 117 described herein above, if the sampling signal is substantially symmetric, e.g., its asymmetry is smaller than a predetermined level or criterion, the sampling rate is substantially equal to the target rate.

In accordance with one preferred embodiment of the present invention, the calculated rate discrepancy is used for adjusting the rate estimate in a step 138. A rate control signal is generated with the adjusted rate and process 100 returns to step 132 of generating the sampling signal with the adjusted sampling rate. The generated sampling signal is waveform shaped in step 134 and examined for synchronization states in steps 135 and 137. The rate adjusting, sampling signal generating, waveform shaping, and error detection form a rate fine tuning cycle comprised of steps 132, 134, 135, 137, and 138 operate in a way similar that of steps 104, 105, 107, and 108 and steps 114, 115, 117, and 118 described above. The cycle generally continues until the waveform asymmetry reduces to substantially zero or below the predetermined level, which corresponds to the sampling rate being substantially synchronized with or locked onto the baud rate of the input signal. In addition, the cycle may terminate as failing to lock in response to the sampling signal becoming unstable and the jittering exceeding a predetermined level. In response thereto, process 100 proceeds from step 135 to step 106 as described herein above.

The fine tuning synchronization cycle of steps 132, 134, 135, 137, and 138 includes sampling signal waveform shaping step 134. In data transmission rate acquisition circuit 10 shown in FIG. 1, this is achieved by routing the sampling signal from variable decimator 16 to timing error detector 24 through square root filter 18 in accordance with an embodiment of the present invention. The waveform shaping enables synchronization steps 135 and 137 to acquire the target data rate with high accuracy. In accordance with a preferred embodiment of the present invention, the jittering level criterion or threshold at step 135 is set lower than those at steps 105 and 115. Likewise, the signal waveform symmetry criterion at step 137 is higher than those at steps 107 and 117 in accordance with a preferred embodiment of the present invention. In accordance with another preferred embodiment of the present invention, step 137 stores the calculated rate discrepancy in a data storage unit. The locked-in or synchronized rate is set equal to the sampling rate adjusted by the rate discrepancy. In this embodiment, process 100 does not include step 138 and the rate adjusting cycle of steps 132, 134, 137, and 138. In response to a successful rate locking, process 100 ends at a step 141 after accurately acquiring the baud rate of the input signal and synchronizing the receiver with the input signal.

In accordance with the present invention, data transmission rate acquisition process 100 includes two fast rate acquisition or rate sweeping stages comprised of steps 104 and 105 and steps 114 and 115 followed up one rate fine tuning stage comprised of steps 132, 134, and 135. During the fast rate acquisition stages, steps 105 and 115 examines the sampling signals generated in steps 104 and 114, respectively without waveform shaping the sampling signal. Steps 105 and 115 of examining the sampling signal without waveform shaping provide a large rate acquisition range. Rate sweeping step 106 during the fast rate acquisition stages can have a large rate shift width for quickly shift the data transmission rate estimate and catch the target rate. During the fine tuning stage, steps 135 and 137 examine the waveform shaped sampling signal to accurately synchronize the sampling signal to the baud rate of the input signal. The combination of the fast rate acquisition and fine tuning stages in data transmission acquisition process 100 provides a quick and accurate process of synchronizing the sampling rate of a receiver to the baud rate of the input signal.

It should be understood that FIG. 2 describes only rate synchronization process 100 in accordance with a specific embodiment of the present invention. It is should be understood that process 100 described herein above is not a exhaustive description of the baud rate synchronizing process in accordance with the present invention. For example, a baud rate synchronization process in accordance an alternative embodiment of the present invention does not include steps 112, 114, 115, 117, 118 and 125 shown in FIG. 2. In such alternative embodiment, the synchronization process performs fine tuning sampling rate synchronization in response to a successful rate lock through rate sweeping cycle of steps 104, 105, and 106.

In addition, step 135 of checking the jittering of the waveform shaped sampling signal and returning to step 106 of rate sweeping is optional in process 100 in accordance with the present invention. During the rate sweeping stage, either in the two rate sweeping stage embodiment shown in FIG. 2 or in the one rate sweeping stage embodiment without steps 112, 114, 115, 117, 118 and 125, the synchronized rate is close to the target rate, the fine tuning stage functions to further improve the rate synchronization accuracy. The waveform shaped sampling generated in step 134 of process 100 is generally within the baud rate acquisition range without significant jittering. Step 137 detects minor asymmetry in the waveform shaped sampling signal and further adjusts the sampling rate to accurately synchronize the sampling signal with the input signal.

By now it should be appreciated that a signal rate synchronization circuit and a process for locking or synchronizing the sampling rate of a digital signal receiver to the baud rate of the received signal have been provided. In accordance with a preferred embodiment of the present invention, a rate synchronization circuit includes signal selection element that enables a timing error detector to alternately receive sampling signals from a decimator bypassing or through a waveform shaping filter. A baud rate synchronization process in accordance with a preferred embodiment of the present invention includes baud rate estimate, pre-filtering rate synchronization, and post-filtering fine tuning rate synchronization. In the pre-filtering rate synchronization phase, the sampling signal bypasses a waveform shaping filter, e.g., a square root filter. Without waveform shaping, the rate synchronization process is capable of capturing the target baud rate over a wide range. Combined with rate sweeping, the pre-filtering rate synchronization phase can quickly lock onto the target rate over a wide range, even without prior knowledge of approximate baud rate of the input signal. In accordance with a preferred embodiment, the pre-filtering synchronization phase includes a rate shifting step after a first successful rate lock. The shifted rate goes through a second synchronization phase with the locked rate to be compared with the first locked rate, thereby minimizing the likelihood of false rate lock. The subsequent post-filtering synchronization phase fine tunes the sampling rate and provides an accurate rate synchronization. Therefore, a baud rate synchronization process in accordance with the present invention is capable of quickly and accurately acquiring the baud rate of the input signal and synchronizing the sampling rate with the baud rate over a wide range. For example, in a digital cable video broadcasting application, the baud rate is typically in a range between one mega-bytes per seconds (Mbps) and seven Mbps. In a prior art rate acquisition process with rate sweeping step of about one kilo-Hertz and synchronization time of about 20 milli-seconds (ms), the rate acquisition time is about two minutes. However, in a rate synchronization process in accordance with an embodiment of the present invention, the rate estimation takes about 10 ms with an accuracy of 150 kHz, the pre-filtering rate sweeping and synchronization with a sweeping step of 10 kHz takes about 600 ms, and the post-filtering fine tuning takes about 20 ms. The total synchronization process takes about 630 ms, which is about 190 times faster than the prior rate acquisition process. More significantly, a digital signal receiver, e.g., a HDTV receiver, can lock in the input signal baud rate in less than one second. For most consumers, a delay time less than one second after turning on a television set is negligible.

While specific embodiments of the present invention have been described herein above, they are not intended as limitations on the scope of the invention. The present invention encompasses those modifications and variations of the described embodiments that are obvious to those skilled in the art. For example, the baud rate synchronization process in accordance with the present invention is applicable in any fields that need to synchronize an internal signal processing rate with a rate of the received signal. Such applications include, but are not limited to, internet data transmission, satellite communication, microwave communication wireless data communication, cable data communication, etc.

The invention claimed is:

1. A process for synchronizing a sampling rate to a data transmission rate of an input signal, comprising the steps of:
   selecting a baud rate by estimating the data transmission rate of the input signal;
   generating a rate control signal in response to the baud rate;
   generating a sampling signal sampling the input signal at a sampling rate in response to the rate control signal;
   measuring a jittering of the sampling signal;
   in response to the jittering being greater than a level indicating the sampling rate being outside a baud rate acquisition range from the data transmission rate of the input signal:
      shifting the baud rate by a first rate shifting width greater than the baud rate acquisition range associated with the sampling signal; and
      returning to the step of generating a rate control signal in response to the baud rate;
   generating a rate error signal by examining a waveform of the sampling signal;
   generating a synchronized rate from the rate error signal;
   selecting a second baud rate different from the synchronized rate by a rate width smaller than the rate acquisition range associated with the sampling signal;
   generating a second rate control signal in response to the second baud rate;
   generating a second sampling signal sampling the input signal in response to the second rate control signal;
   measuring a second jittering of the second sampling signal;
   in response to the second jittering being greater than a level indicating the second sampling rate being outside a baud rate acquisition range from the data transmission rate of the input signal:
      shifting the second baud rate by a second rate shifting width greater than the baud rate acquisition range associated with the second sampling signal; and
      returning to the step of generating a rate control signal in response to the baud rate;
   generating a second rate error signal by examining a waveform of the second sampling signal;
   generating a second synchronized rate from the second rate error signal;
   comparing the synchronized rate and the second synchronized rate;
   in response to the synchronized rate substantially different from the second synchronized rate, returning to the step of shifting the baud rate by a first rate shifting width greater than the baud rate acquisition range associated with the sampling signal;
   generating the sampling signal having the synchronized rate;
   shaping a waveform of the sampling signal to generate a waveform shaped signal;
   generating a waveform shaped rate error signal by examining a waveform of the waveform shaped signal;
   generating a waveform shaped synchronized rate from the waveform shaped rate error signal; and
   generating the sampling signal having the waveform shaped synchronized rate.

2. The process of claim 1, the step of selecting a baud rate by estimating the data transmission rate of the input signal including the steps of:
   transmitting the input signal to an impulse response filter; and
   estimating the data transmission rate of the input signal by examining an output power of the impulse response filter.

3. The process of claim 1, the step of shifting the baud rate by a first rate shifting width including selecting a new baud rate in a zigzag rate sweeping pattern.

4. The process of claim 1, the step of shaping a waveform of the sampling signal including transmitting the sampling signal to a square root filter to generate the waveform shaped signal.

5. The process of claim 1, the step of generating a sampling signal sampling the input signal at a sampling rate in response to the rate control signal including generating the sampling signal with a variable decimator having a control input receiving the rate control signal.

6. The process of claim 1, the step of generating a synchronized rate from the rate error signal including the step of generating the synchronized rate as equal to the baud rate adjusted by the rate error signal.

7. The process of claim 1, the step of generating a synchronized rate from the rate error signal including the steps of:
   in response to the rate error signal being greater than a predetermined value:
      adjusting the baud rate with the rate error signal; and
      returning to the step of generating the rate control signal in response to the baud rate; and
   generating the synchronized rate as equal to the baud rate.

8. The process of claim 1, further comprising, before performing the step of generating a waveform shaped rate error signal by examining a waveform of the waveform shaped signal, the steps of:
   measuring a jittering of the waveform shaped signal;
   in response to the jittering of the waveform shaped signal being greater than a level indicating a sampling rate of the waveform shaped signal rate being outside a baud rate acquisition range associated with the waveform shaped signal from the data transmission rate of the input signal:
      selecting the baud rate by shifting synchronized rate by a second rate shifting width greater than the baud rate acquisition range associated with the waveform shaped signal; and
      returning to the step of generating a rate control signal in response to the baud rate; and
   proceeding to the step of generating a waveform shaped rate error signal by examining a waveform of the waveform shaped signal.

9. The process of claim 1, the step of generating a sampling signal sampling the input signal at a sampling rate in response to the rate control signal including generating the sampling signal at the sampling rate equal to two times of the baud rate.

10. A baud rate acquisition process, comprising:
   selecting a baud rate by estimating a data transmission rate of an input signal;
   generating a rate control signal based on the baud rate;
   generating a sampling signal sampling the input signal at a sampling rate in response to the rate control signal;
   examining a waveform of the sampling signal;
   in response to the sampling signal having a jittering greater than a first level:
      shifting the baud rate by a first rate shifting width; and
      returning to generating a rate control signal based on the baud rate;
   synchronizing the sampling signal with the input signal to yield a synchronized rate;
   shaping a waveform of the sampling signal having the synchronized rate to generate a waveform shaped signal;
   synchronizing the waveform shaped signal with the input signal to yield a waveform shaped synchronized rate, including:
      measuring an asymmetry of the waveform shaped signal; and
      in response to the asymmetry of the waveform shaped signal being greater than a predetermined value:
         adjusting the synchronized rate with a waveform shaped rate discrepancy calculated from the asymmetry of the waveform shaped signal;
         generating the rate control signal based on the synchronized rate;
         generating the sampling signal with the rate control signal;
         waveform shaping the sampling signal; and
         returning to measuring an asymmetry of the waveform shaped signal; and
      outputting the synchronized rate as the waveform shaped synchronized rate; and
   generating the sampling signal having a sampling rate corresponding to the waveform shaped synchronized rate.

11. The baud rate acquisition process of claim 10, selecting a baud rate by estimating a data transmission rate of an input signal including:
   transmitting the input signal to an impulse response filter; and
   estimating the data transmission rate of the input signal by examining an output power of the impulse response filter.

12. The baud rate acquisition process of claim 11, wherein transmitting the input signal to an impulse response filter includes transmitting the input signal to an infinite impulse response filter.

13. The baud rate acquisition process of claim 11, wherein transmitting the input signal to an impulse response filter includes transmitting the input signal to a finite impulse response filter.

14. The baud rate acquisition process of claim 10, generating a sampling signal sampling the input signal at a sampling rate in response to the rate control signal including generating the sampling signal with a variable decimator having a control input receiving the rate control signal.

15. The baud rate acquisition process of claim 10, wherein the jittering of the sampling signal greater than the first level corresponds to the sampling signal outside a baud rate acquisition range associated with the sampling signal.

16. The baud rate acquisition process of claim 15, shifting the baud rate by a first rate shifting width including shifting the baud rate by a rate shifting width greater than the baud rate acquisition range associated with the sampling signal.

17. The baud rate acquisition process of claim 10, shifting the baud rate by a first rate shifting width including selecting a new baud rate in a zigzag rate sweeping pattern.

18. The baud rate acquisition process of claim 10, synchronizing the sampling signal with the input signal to yield a synchronized rate including:
   in response to an asymmetry of the sampling signal being greater than a predetermined value:
      adjusting the baud rate with a rate discrepancy calculated from the asymmetry of the sampling signal; and
      returning to generating a rate control signal based on the baud rate; and
   generating the synchronized rate as equal to the baud rate.

19. The baud rate acquisition process of claim 10, synchronizing the sampling signal with the input signal to yield a synchronized rate including:
   measuring an asymmetry of the sampling signal;

calculating a rate discrepancy from the asymmetry of the sampling signal; and generating the synchronized rate as equal to the baud rate adjusted by the rate discrepancy.

20. The baud rate acquisition process of claim 10, shaping a waveform of the sampling signal including transmitting the sampling signal to a square root filter to generate the waveform shaped signal.

21. The baud rate acquisition process of claim 10, generating a sampling signal sampling the input signal at a sampling rate in response to the rate control signal including generating the sampling signal at the sampling rate equal to two times of the baud rate.

22. The baud rate acquisition process of claim 10, further comprising, before performing synchronizing the waveform shaped signal with the input signal to yield a waveform shaped synchronized rate:
examining the waveform shaped signal;
in response to the waveform shaped signal having a jittering greater than a second level:
selecting the baud rate by shifting synchronized rate by a second rate shifting width; and
returning to generating a rate control signal based on the baud rate; and
proceeding to synchronizing the waveform shaped signal with the input signal to yield a waveform shaped synchronized rate.

23. The baud rate acquisition process of claim 22, wherein the waveform shaped signal having a jittering greater than the second level corresponds to the synchronized rate being outside a baud rate acquisition range associated with the waveform shaped signal from the input signal.

24. The baud rate acquisition process of claim 23, wherein selecting the baud rate by shifting synchronized rate by a second rate shifting width includes shifting the synchronized rate by a width greater than the baud rate acquisition range associated with the waveform shaped signal.

25. The baud rate acquisition process of claim 10, further comprising, before performing shaping a waveform of the sampling signal having the synchronized rate to generate a waveform shaped signal:
selecting a second baud rate; generating a second rate control signal based on the second baud rate;
generating a second sampling signal sampling the input signal at a second sampling rate in response to the second rate control signal;
examining a jittering of the second sampling signal;
in response to the jittering of the second sampling signal greater than the first level:
generating the baud rate as equal to the second baud rate shifted by the first rate shifting width; and
returning to generating a rate control signal based on the baud rate;
synchronizing the second sampling signal with the input signal to yield a second synchronized rate;
comprising the synchronized rate and the second synchronized rate;
in response to the synchronized rate and the second synchronized rate being different from each other, returning to shifting the baud rate by a first rate shifting width; and
proceeding to shaping a waveform of the sampling signal having the synchronized rate to generate a waveform shaped signal.

26. The baud rate acquisition process of claim 25, wherein synchronizing the second sampling signal with the input signal to yield a second synchronized rate includes:
measuring a second asymmetry of the second sampling signal;
calculating a rate discrepancy from the second asymmetry; and generating the second synchronized rate as equal to the second baud rate adjusted by the second rate discrepancy.

27. The baud rate acquisition process of claim 25, selecting a second baud rate including selecting the second baud rate as the synchronized rate shifted by a rate difference smaller than a baud rate acquisition range associated with the sampling signal.

28. A process for synchronizing a sampling rate to a data transmission rate of an input signal, comprising the steps of:
selecting a baud rate by estimating the data transmission rate of the input signal;
generating a rate control signal in response to the baud rate;
generating a sampling signal sampling the input signal at a sampling rate in response to the rate control signal;
measuring a jittering of the sampling signal;
in response to the jittering being greater than a level indicating the sampling rate being outside a baud rate acquisition range from the data transmission rate of the input signal:
shifting the baud rate by a first rate shifting width greater than the baud rate acquisition range associated with the sampling signal; and
returning to the step of generating a rate control signal in response to the baud rate;
generating a rate error signal by examining a waveform of the sampling signal;
generating a synchronized rate from the rate error signal;
generating the sampling signal having the synchronized rate;
shaping a waveform of the sampling signal to generate a waveform shaped signal;
measuring a jittering of the waveform shaped signal;
in response to the jittering of the waveform shaped signal being greater than a level indicating a sampling rate of the waveform shaped signal rate being outside a baud rate acquisition range associated with the waveform shaped signal from the data transmission rate of the input signal:
selecting the baud rate by shifting synchronized rate by a second rate shifting width greater than the baud rate acquisition range associated with the waveform shaped signal; and
returning to the step of generating a rate control signal in response to the baud rate;
generating a waveform shaped rate error signal by examining a waveform of the waveform shaped signal;
generating a waveform shaped synchronized rate from the waveform shaped rate error signal; and
generating the sampling signal having the waveform shaped synchronized rate.

29. The process of claim 28, the step of selecting a baud rate by estimating the data transmission rate of the input signal including the steps of:
transmitting the input signal to an impulse response filter; and
estimating the data transmission rate of the input signal by examining an output power of the impulse response filter.

30. The process of claim 28, the step of shifting the baud rate by a first rate shifting width including selecting a new baud rate in a zigzag rate sweeping pattern.

31. The process of claim 28, the step of shaping a waveform of the sampling signal including transmitting the sampling signal to a square root filter to generate the waveform shaped signal.

32. The process of claim 28, further comprising, before performing the step of generating the sampling signal having the synchronized rate, the steps of:
    selecting a second baud rate different from the synchronized rate by a rate width smaller than the rate acquisition range associated with the sampling signal;
    generating a second rate control signal in response to the second baud rate;
    generating a second sampling signal sampling the input signal in response to the second rate control signal;
    measuring a second jittering of the second sampling signal;
    in response to the second jittering being greater than a level indicating the second sampling rate being outside a baud rate acquisition range from the data transmission rate of the input signal:
        shifting the second baud rate by a second rate shifting width greater than the baud rate acquisition range associated with the second sampling signal; and
        returning to the step of generating a rate control signal in response to the baud rate;
    generating a second rate error signal by examining a waveform of the second sampling signal;
    generating a second synchronized rate from the second rate error signal;
    comparing the synchronized rate and the second synchronized rate;
    in response to the synchronized rate substantially different from the second synchronized rate, returning to the step of shifting the baud rate by a first rate shifting width greater than the baud rate acquisition range associated with the sampling signal; and
    proceeding to perform the step of generating the sampling signal having the synchronized rate.

33. The process of claim 28, the step of generating a sampling signal sampling the input signal at a sampling rate in response to the rate control signal including generating the sampling signal with a variable decimator having a control input receiving the rate control signal.

34. The process of claim 28, the step of generating a synchronized rate from the rate error signal including the step of generating the synchronized rate as equal to the baud rate adjusted by the rate error signal.

35. The process of claim 28, the step of generating a synchronized rate from the rate error signal including the steps of:
    in response to the rate error signal being greater than a predetermined value:
        adjusting the baud rate with the rate error signal; and
        returning to the step of generating the rate control signal in response to the baud rate; and
    generating the synchronized rate as equal to the baud rate.

36. The process of claim 28, the step of generating a sampling signal sampling the input signal at a sampling rate in response to the rate control signal including generating the sampling signal at the sampling rate equal to two times of the baud rate.

37. A baud rate acquisition process, comprising:
    selecting a baud rate by estimating a data transmission rate of an input signal;
    generating a rate control signal based on the baud rate;
    generating a sampling signal sampling the input signal at a sampling rate in response to the rate control signal;
    examining a waveform of the sampling signal;
    in response to the sampling signal having a jittering greater than a first level:
        shifting the baud rate by a first rate shifting width; and
        returning to generating a rate control signal based on the baud rate;
    synchronizing the sampling signal with the input signal to yield a synchronized rate;
    shaping a waveform of the sampling signal having the synchronized rate to generate a waveform shaped signal;
    examining the waveform shaped signal;
    in response to the waveform shaped signal having a jittering greater than a second level:
        selecting the baud rate by shifting synchronized rate by a second rate shifting width; and
        returning to generating a rate control signal based on the baud rate;
    synchronizing the waveform shaped signal with the input signal to yield a waveform shaped synchronized rate; and
    generating the sampling signal having a sampling rate corresponding to the waveform shaped synchronized rate.

38. A baud rate acquisition process, comprising:
    selecting a baud rate by estimating a data transmission rate of an input signal;
    generating a rate control signal based on the baud rate;
    generating a sampling signal sampling the input signal at a sampling rate in response to the rate control signal;
    examining a waveform of the sampling signal;
    in response to the sampling signal having a jittering greater than a first level:
        shifting the baud rate by a first rate shifting width; and
        returning to generating a rate control signal based on the baud rate;
    synchronizing the sampling signal with the input signal to yield a synchronized rate;
    selecting a second baud rate;
    generating a second rate control signal based on the second baud rate;
    generating a second sampling signal sampling the input signal at a second sampling rate in response to the second rate control signal;
    examining a jittering of the second sampling signal;
    in response to the jittering of the second sampling signal greater than the first level:
        generating the baud rate as equal to the second baud rate shifted by the first rate shifting width; and
        returning to generating a rate control signal based on the baud rate;
    synchronizing the second sampling signal with the input signal to yield a second synchronized rate;
    comprising the synchronized rate and the second synchronized rate;
    in response to the synchronized rate and the second synchronized rate being different from each other, returning to shifting the baud rate by a first rate shifting width;
    shaping a waveform of the sampling signal having the synchronized rate to generate a waveform shaped signal;
    synchronizing the waveform shaped signal with the input signal to yield a waveform shaped synchronized rate; and
    generating the sampling signal having a sampling rate corresponding to the waveform shaped synchronized rate.

39. The baud rate acquisition process of claim 38, wherein synchronizing the second sampling signal with the input signal to yield a second synchronized rate includes:
    measuring a second asymmetry of the second sampling signal;
    calculating a rate discrepancy from the second asymmetry; and generating the second synchronized rate as equal to the second baud rate adjusted by the second rate discrepancy.

40. The baud rate acquisition process of claim 38, selecting a second baud rate including selecting the second baud rate as the synchronized rate shifted by a rate difference smaller than a baud rate acquisition range associated with the sampling signal.

* * * * *